(12) United States Patent
Dittli et al.

(10) Patent No.: US 9,537,042 B2
(45) Date of Patent: *Jan. 3, 2017

(54) NON-ABLATIVE LASER PATTERNING (71) Applicant: nLIGHT Photonics Corporation, Vancouver, WA (US)

(72) Inventors: Adam Dittli, Vancouver, WA (US); Robert J. Martinsen, West Linn, OR (US); Ken Gross, Vancouver, WA (US)

(73) Assignee: nLIGHT, Inc., Vancouver, WA (US)

( * ) Notice: Subject to any disclaimer, the term of this patent is extended or adjusted under 35 U.S.C. 154(b) by 529 days.

This patent is subject to a terminal disclaimer.

(21) Appl. No.: 14/030,799

(22) Filed: Sep. 18, 2013

(65) Prior Publication Data

US 2014/0230967 A1     Aug. 21, 2014

Related U.S. Application Data

(60) Provisional application No. 61/818,881, filed on May 2, 2013, provisional application No. 61/767,420, filed on Feb. 21, 2013.

(51) Int. Cl.
*H01B 13/00* (2006.01)
*H01L 31/18* (2006.01)
*H05K 3/02* (2006.01)

(52) U.S. Cl.
CPC .............. *H01L 31/1884* (2013.01); *H05K 3/02* (2013.01); *G06F 2203/04112* (2013.01);
(Continued)

(58) Field of Classification Search
CPC ................... H01L 31/022466; H01L 31/1884; H01L 21/02686; B82Y 30/00
See application file for complete search history.

(56) References Cited

U.S. PATENT DOCUMENTS 3,388,461 A    6/1968   Lins
4,713,518 A    12/1987  Yamazaki et al.
(Continued)

FOREIGN PATENT DOCUMENTS

CN    101143405    3/2008
CN    101303269    11/2008
(Continued)

OTHER PUBLICATIONS

Steve Gardner, "Precision Photolithography on Flexible Substrates," available at "http://azorescorp.com/downloads/Articles/AZORESFlexSubstrate.pdf" prior to Jan. 30, 2013.
(Continued)

*Primary Examiner* — Jie Yang
*Assistant Examiner* — Xiaowei Su
(74) *Attorney, Agent, or Firm* — Klarquist Sparkman, LLP (57) ABSTRACT

A method for processing a transparent substrate includes generating at least one laser pulse having laser parameters selected for non-ablatively changing a conductive layer disposed on the transparent substrate into a non-conductive feature, and directing the pulse to said conductive layer. A protective film may be affixed to a surface of the transparent substrate and need not be removed during the processing of the substrate. After processing, processed areas can be visually indistinguishable from unprocessed areas.

20 Claims, 4 Drawing Sheets

(52) U.S. Cl.
CPC ............ *H05K 2201/0108* (2013.01); *H05K 2201/026* (2013.01); *H05K 2203/107* (2013.01); *H05K 2203/1142* (2013.01); *Y02E 10/50* (2013.01)

(56) References Cited

U.S. PATENT DOCUMENTS

| | | | |
|---|---|---|---|
| RE37,585 E | 3/2002 | Mourou et al. | |
| 6,426,840 B1 | 7/2002 | Partanen et al. | |
| 7,781,778 B2 | 8/2010 | Moon et al. | |
| 8,269,108 B2 | 9/2012 | Kunishi et al. | |
| 8,310,009 B2 | 11/2012 | Saran et al. | |
| 2003/0213998 A1 | 11/2003 | Hsu et al. | |
| 2004/0112634 A1 | 6/2004 | Tanaka et al. | |
| 2004/0207936 A1 | 10/2004 | Yamamoto et al. | |
| 2005/0168847 A1 | 8/2005 | Sasaki | |
| 2005/0233557 A1 | 10/2005 | Tanaka et al. | |
| 2006/0275705 A1 | 12/2006 | Dorogy et al. | |
| 2008/0246024 A1 | 10/2008 | Touwslager et al. | |
| 2009/0122377 A1 | 5/2009 | Wagner | |
| 2009/0274833 A1 | 11/2009 | Li et al. | |
| 2010/0230665 A1 | 9/2010 | Verschuren et al. | |
| 2012/0127097 A1 | 5/2012 | Gaynor et al. | |
| 2012/0148823 A1 | 6/2012 | Chu | |
| 2012/0156458 A1 | 6/2012 | Chu | |
| 2012/0295071 A1* | 11/2012 | Sato ........................ | G06F 3/041 428/188 |
| 2012/0301733 A1 | 11/2012 | Eckert et al. | |
| 2012/0301737 A1 | 11/2012 | Labelle et al. | |
| 2013/0005139 A1 | 1/2013 | Krasnov et al. | |
| 2013/0022754 A1* | 1/2013 | Bennett ................ | B41C 1/1041 427/532 |
| 2013/0023086 A1 | 1/2013 | Chikama et al. | |
| 2013/0027648 A1 | 1/2013 | Moriwaki | |
| 2013/0095260 A1 | 4/2013 | Bovatsek et al. | |
| 2013/0228442 A1 | 9/2013 | Mohaptatra et al. | |
| 2014/0332254 A1* | 11/2014 | Pellerite ............... | G02F 1/13439 174/251 |

FOREIGN PATENT DOCUMENTS

| | | |
|---|---|---|
| CN | 101314196 | 12/2008 |
| CN | 201783759 | 4/2011 |
| CN | 102441740 | 5/2012 |
| DE | 203 20 269 | 4/2004 |
| EP | 2587564 | 5/2013 |
| EP | 2587564 A1 | 5/2013 |
| JP | H02220314 | 9/1990 |
| JP | 2006-106227 | 4/2006 |
| JP | 2008-281395 | 11/2008 |
| RU | 2008742 | 2/1994 |
| TW | 200633062 | 9/2006 |
| TW | 200707466 | 2/2007 |
| TW | 201307949 | 2/2013 |

OTHER PUBLICATIONS

Choong-Heui Chung et al., "Solution-Processed Flexible Transparent Conductors Composed of Silver Nanowire Networks Embedded in Indium Tin Oxide Nanoparticle Matrices," Nano Research, Sep. 24, 2012, Springer.
International Search Report, PCT/US2013/060470, issued Jan. 16, 2014, 3 pages.
Written opinion, PCT/US2013/060470, issued Dec. 5, 2013, 4 pages.
International Search Report, PCT/US2014/017841, issued Jun. 5, 2014, 3 pages.
Written opinion, PCT/US2014/017841, issued Jun. 5, 2014, 3 pages.
Chung, "Solution-Processed Flexible Transparent Conductors Composed of Silver Nanowire Networks Embedded in Indium Tin Oxide Nanoparticle Matrices," Nano Research, 10 pages (Sep. 24, 2012).
Gardner, "Precision Photolithography on Flexible Substrates," http://azorescorp.com/downloads/Articles/AZORESFlexSubstrate. pdf (prior to Jan. 30, 2013).
Grigoriyants et al., "Tekhnologicheskie protsessy lazernoy obrabotki," Moscow, izdatelstvo MGTU im. N.E. Baumana, p. 334 (2006).
International Search Report and Written Opinion for International Application No. PCT/US2013/060470, 7 pages, mailed Jan. 16, 2014.
International Search Report and Written Opinion for International Application No. PCT/US2014/017841, 5 pages, mailed Jun. 5, 2014.
International Search Report and Written Opinion for International Application No. PCT/US2014/017836, 6 pages, mailed Jun. 10, 2014.
Product Brochure entitled "3-Axis and High Power Scanning" by Cambridge Technology, 4 pages, downloaded Dec. 21, 2013.
Product Brochure supplement entitled "Theory of Operation" by Cambridge Technology, 2 pages, downloaded Dec. 21, 2013.
Search Report from the Taiwan Intellectual Property Office for related Application No. 102139285, mailed Sep. 1, 2015 (w/ Eng. trans.).
3-Axis Laser Scanning Systems, downloaded from http://www.camtech.com/index.php?option=com_content&view=article&id=131&Itemid=181, 4 pages, Dec. 31, 2014.
Official Letter and Search Report from the Taiwan Intellectual Property Office for related Application No. 103106020, 21 pages, mailed Apr. 20, 2016 (w/ Eng. trans.).
First Office Action from Chinese Application No. 201410455972.X, dated Jan. 26, 2016, 21 pages (with English translation).
Official Letter and Search Report from the Taiwan Intellectual Property Office for related Application No. 102139285, 21 pages, mailed Jun. 13, 2016 (w/ Eng. trans.).

* cited by examiner

NON-ABLATIVE LASER PATTERNING

CROSS-REFERENCE TO RELATED APPLICATIONS

This patent application claims the benefit of U.S. Provisional Patent Applications 61/767,420 filed Feb. 21, 2013, and 61/818,881 filed May 2, 2013, both of which are incorporated herein by reference in their entirety.

BACKGROUND OF THE INVENTION

1. Field of the Invention

Generally, the field of the present invention is laser patterning. More particularly, the present invention relates to the laser patterning of transparent conductive films.

2. Background

Strong demand for smaller and more portable computing devices has led to substantial innovation in many corresponding areas, including touch screens for smartphones and tablet computers. However, the path of innovation has not kept pace with manufacturing, particularly in the area of touch sensor patterning and printed electronics. Existing technologies, including photolithography, screen printing, and laser processing, suffer from poor takt (cycle) times due in part to the number of processing steps required. In addition to costs associated with poor cycle time, photolithographic and screen printing techniques include numerous drawbacks, including increased cost associated with expensive consumables and toxic waste.

Conventional laser processing techniques also suffer from numerous drawbacks. For example, laser beams are typically scanned across a target at great cost to cycle time. Moreover, in the processing of the targets the beams ablate away material which leaves visible or barely visible marks on the target. At least in the area of consumer products, it is highly desirable to process targets, such as touch screens, such that no visible effects are left on the surface at any angle or under any lighting conditions. In another serious drawback, and together with photolithographic and screen printing techniques, for flexible transparent substrates, a protective film must be removed prior to processing the substrate and reattached afterwards, leading to substantial further delay and increased processing expense. Thus, it is unfortunate that the current state of the art has yet to produce an efficient and superior technique for processing printed electronics and touch sensors on transparent substrates. Accordingly, there remains a need for a method for processing transparent substrates without the attendant drawbacks.

SUMMARY OF THE INVENTION

The present invention is directed to satisfying the aforementioned need by providing an innovation in the form of laser processes which change the conductivity of a surface of a substrate without ablating the material thereof. Thus, according to one aspect of the present invention, a method is provided for processing a transparent substrate, the method including the steps of generating at least one laser pulse having laser parameters selected for non-ablatively changing a conductive layer disposed on the transparent substrate into a non-conductive feature, and directing the pulse to the conductive layer.

In another aspect of the present invention, a method is provided for changing the sheet resistance of a conductive matrix of silver nanowires on a flexible transparent substrate, the method including generating at least one pulse with laser parameters selected in a range for increasing the sheet resistance of the conductive matrix without ablating the silver nanowires, and directing the pulse to the conductive matrix to increase the sheet resistance.

In a further aspect of the present invention, a method for processing a transparent substrate with a pulsed laser beam, the substrate being characterized by having a conductive material disposed on a selected surface thereof, the conductive material capable of experiencing non-ablative change into non-conductive material with a pulsed laser beam having selected parameters, the method including the steps of generating at least one laser pulse with the selected parameters, and directing the pulse to the conductive material on the substrate to produce the change into non-conductive material.

In a further aspect of the present invention, a method for processing a conductive material layer of a flexible transparent substrate with a pulsed laser beam, the conductive material layer characterized in that exposure to a laser pulse having selected laser pulse parameters causes the conductive material to become non-conductive material without ablatively removing the material layer, the method including the steps of generating at least one laser pulse which has the selected laser pulse parameters, and directing the pulse to the conductive material layer of the substrate.

In another aspect of the present invention target surfaces can be processed with laser pulses such that processed areas are not visually distinguishable from adjacent unprocessed areas except under substantial magnification. In another aspect of the present invention, a protective layer typically disposed on a surface of the substrate to be processed and removed during processing is instead left intact and not removed from the substrate during processing.

The foregoing and other objects, features, and advantages will become more apparent from the following detailed description, which proceeds with reference to the accompanying figures.

DETAILED DESCRIPTION OF THE INVENTION

Flexible substrates have the advantage of potentially being inexpensive to manufacture, though such efficiencies have not been realized under conventional processes. Accordingly, various examples described herein are directed to the manufacture of processed composite films for different applications, such as transparent conductors for touch-sensitive displays. For example, steps for processing the flexible composite films can be configured so that touch sensitive regions are formed in the flexible composite film such that the touch sensitive regions become suitable for use in various display devices. Other suitable applications for processed substrates can include display devices more generally, as well as LED phosphor enhancements, other commercial and consumer lighting applications, wearable electronics, and photovoltaic cells. However, flexible substrates are particularly well-suited for mobile consumer displays, where thinner, durable, and flexible formats are highly desirable. Moreover, by utilizing the advances described herein, flexible film laser patterning can be achieved with an intact protective layer, enabling true roll to roll processing. In some examples, the substrate can be rigid as well.

Figure 1:
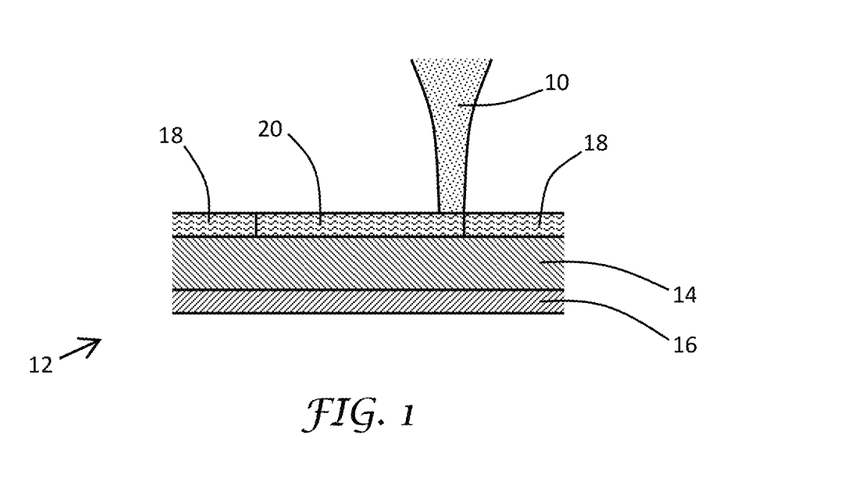
FIG. 1 is a cross-sectional view of laser beam processing a substrate in accordance with an aspect of the present invention.

Referring now to FIG. 1, a cross-sectional view is shown of a pulsed laser beam 10 with selected laser pulse parameters processing a target 12 in accordance with an aspect of the present invention. As shown the target 12 includes a transparent substrate 14 having a protective layer 16 disposed on one side and thin layer 18 of conductive material disposed on the other side opposite from the one side. In many examples, the substrate 14 has a constant or fixed thickness, such as in the range between 50 μm and 200 μm, usually depending upon the application for the substrate and material or materials used. In further examples, additional layers may be disposed in relation to the substrate 14 and associated protective and thin layers 16, 18, such as the formation a composite substrate or a substrate with one or more other materials or layers deposited thereon.

In some examples the layer 18 of conductive material includes a random arrangement of silver nanowires. The silver nanowires of the thin layer 18 are typically secured to the substrate 14 in a polymer matrix, such as an organic overcoat. The laser beam 10 delivers laser pulses to the thin layer 18 and creates a processed portion 20 where the conductivity of the material of layer 18 changes substantially. Herein, the terms "conductive" and "non-conductive" have meanings attributed to them that are generally understood in the art of printed electronics, touch sensor patterning, or optoelectronics. For example, suitable sheet resistances for a material such that it may be considered conductive include 30-250 Ω/sq, and suitable sheet resistances or electrical isolation measurements for a material such that the material may be considered non-conductive or electrically isolated include resistances greater than or equal to about 20 MΩ/sq. However, the aforementioned resistances are merely examples, and other conductive and non-conductive ranges may apply depending on the requirements of the particular application. Some processed substrates may be considered sufficiently conductive where sheet resistances are below 500 Ω/sq, 1 kΩ/sq, 5 kΩ/sq, or 10 kΩ/sq, and may be considered non-conductive where sheet resistances are greater than or equal to about 100 kΩ/sq, 1 MΩ/sq, or 100 MΩ/sq.

Figure 2:
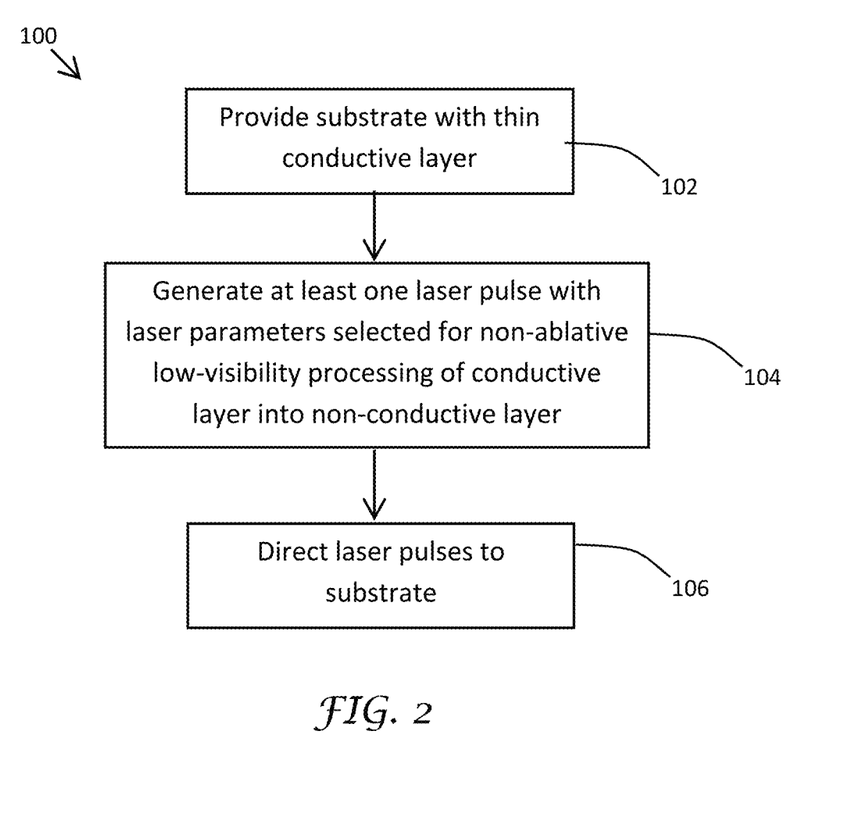
FIG. 2 is a flowchart block diagram of a method in accordance with an aspect of the present invention.

FIG. 2 shows a flowchart block diagram of an exemplary method 100 in accordance with an aspect of the present invention. In a first step 102, a substrate is provided with a thin conductive layer disposed thereon. The substrate is preferably transparent and flexible, but other substrates can be processed in accordance herein without departing from the scope of the present invention. In accordance with another aspect of the present invention, a protective layer or film can be disposed on another surface of the substrate, for example, opposite from the conductive layer and the substrate can be processed without removing the protective layer or film. In a second step 104, at least one laser pulse is generated with laser pulse parameters selected for achieving non-ablative processing of the thin conductive layer on the substrate such that the processed portion of the thin conductive layer becomes non-conductive, and such that the processed portion is also low visibility. In a third step 106, the laser pulse is directed to the substrate. The processed substrate has a different conductivity than the unprocessed substrate such that particular sensory regions and electrical pathways may be formed on the substrate. By carefully selecting the characteristics of the laser pulse parameters, including pulse length, pulse fluence, pulse energy, spot size, pulse repetition rate, and scan speed, the substrate may be processed such that electrical characteristics thereof are altered in a predetermined way while the substrate and associated protective and conductive layers are not substantially damaged or structurally altered through an ablative process. Accordingly, the protective layer 56 need not be removed during processing of the substrate in examples utilizing such a layer.

While the beam 10 in FIG. 1 is generally shown being brought to a focus thereof, other beam geometrical configurations and intensity distributions are possible, including an unfocused beam, line beams, square or rectangular beams, as well as beams with uniform, substantially uniform or pre-selected intensity profiles across one or more transverse axes. In some examples, the beam delivery system providing the beam 10 is also configured to translate the beam 10 in relation to the target 12 so that the beam can form lines, areas, and other geometrical features thereon. In other examples, the target 12 can be translated to form geometrical features while the beam delivery system and beam 10 remain fixed in one or more axes. In still other examples, both the target 12 and the beam 10 can be translated. Moreover, in some examples, the beam 10 impinges the target 12 from the opposite direction such that the beam 10 propagates through the protective layer 16 (if present) and substrate 14 to cause non-ablative effects to the conductive layer 18.

Herein, the term "non-ablative" is understood to mean that the structural features of the existing target surface topology remains intact after laser processing thereof, as will be understood from the disclosure hereinbelow. For example, in non-ablative processes herein, while material changes occur sufficient to change the conductivity or sheet resistance of the target surface, the overall structure of the target surface remains largely unchanged, leading in preferred examples where the processed surface is visually indistinguishable from the adjacent unprocessed areas. For example, in substrates having a layer of silver nanowires in an overcoat thereon, a non-ablative process does not remove or substantially remove the silver nanowires. The overcoat covering the silver nanowires can be removed from the silver nanowires through laser processing herein, without the process being considered ablative. Herein, a non-ablative process does not substantially remove silver nanowires when the removal is incidental to laser processing or substrate handling. Laser ablation is generally understood in the art to mean substantial removal of material due to incident light on a target, by vaporization, photochemical alteration, or otherwise. Laser ablation is generally focused on absorption, ablation threshold, ablation depth, and complete material removal on the target in the vicinity of pulse. Consequently, a focus of industry is on enhancing beam quality and the precision of the trenches formed by the pulse during removal, and the avoidance or mitigation of heat affecting areas adjacent to the location of pulse impingement. Thus, processes disclosed herein operate below an ablation threshold in order to produce non-ablative but actual material effects to target substrates which alter specific characteristics, such as conductivity.

Figure 3:
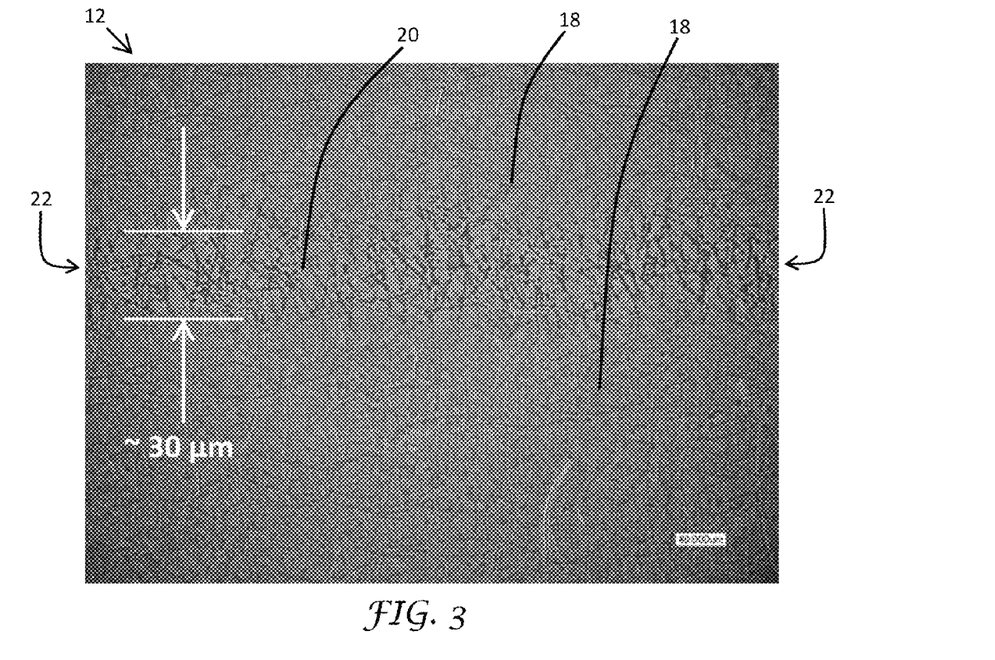
FIG. 3 is a top view image of a laser beam patterned substrate in accordance with an aspect of the present invention.

While the laser pulses of the laser beam 10 cause the processed portion 20 to become non-conductive, the visible characteristics of the processed portion 20 remain substantially unchanged. Thus, the distinction between processed and unprocessed portions 20, 18 is unnoticeable without the aid of an image enhancement mechanism, such as a microscope, including across multiple viewing angles. Referring to FIG. 3, a microscope image is shown, magnified to 1500× under monochromatic illumination, of a top view of a substrate 14 processed in accordance with a laser method aspect of the present invention. A horizontal stripe 22 of processed silver nanowires, which is barely noticeable to an unaided eye even under substantial magnification, is shown that is approximately 30 μm wide, as indicated in the figure. The laser pulse parameters used to provide superior non-ablative results shown in the stripe 22 include a pulse length of about 50 ps, pulse fluence of about 0.17 $J/cm^2$, at a spot size of about 40 μm $1/e^2$, scan rate of about 1 m/s with a pulse-to-pulse overlap of greater than 90%, a total pulse energy of about 12 μJ, and a pulse repetition rate of about 100 kHz.

The aforementioned laser pulse parameter values are merely examples, and other parameters may be selected and optimized for different targets and systems. Additionally, parameter values can be scaled for a variety of processing speeds, provided pulse overlap and pulse energy are maintained in parameter ranges suitable for producing non-ablative non-conductive effects. Thus, pulse repetition rates can be increased to 1 MHz, 10 s of MHz, or more to increase processing speeds provided the requisite laser and beam delivery architectures are configured accordingly. Pulse length can be selected to be shorter or longer and other parameters, such as pulse fluence, can be adjusted to ensure that target is processed non-ablatively into a non-conductive feature. For example, possible pulse lengths include less than about 1 ps, 100 ps, 200 ps, 500 ps, 800 ps, or 1 ns. Other parameters can similarly be varied and optimized accordingly.

After formation, the two portions of the target 12 above and below the stripe 22 become electrically isolated from each other due to the change in sheet resistance imparted to the processed area 20 by the pulses from the laser beam 10, effectively forming a barrier to conductive flow of electricity. As material specifications change, other parameters can be carefully selected using heuristic or other optimization approaches to achieve the non-ablative conductivity-altering aspects of the processes of the present invention while maintaining ultra-low visibility of the processed area as compared to unprocessed areas. The laser beam 10 can also be modified to have a shape other than Gaussian, such as flat-top, super-Gaussian, etc. Laser systems capable of operating the laser parameter regime of the present invention generally include pulsed fiber lasers, pulsed fiber amplifiers, and diode pumped solid-state lasers.

Accordingly, shapes and patterns can be formed on the substrate with the methods disclosed herein so as to achieve electrical isolation from one unprocessed area to the next. In addition to not requiring a mask, photoresists, etch baths, replacing or providing additional protective films, the use of a laser or a scanned laser provides a highly configurable process, allowing for sheet-to-sheet, roll-to-sheet, roll-to-roll (R2R), or roll to finished sensor manufacturing. Scanned lasers can be programmed with an image file to have the process tailored easily for or between various pattern geometries and substrates. Moreover, by utilizing the ultra-low visibility process aspects described herein, even more reductions in cycle time can be achieved over conventional laser or chemical processes. For example, in a conventional laser process, in order to reduce the visibility of ablatively processed areas, additional areas must be unnecessarily processed in order to provide a uniform pattern effect that effectively decreases the overall visibility of the ablative marks to the unaided eye of a user. Because the processing aspects of the present invention result in ultra-low visibility marks to begin with, the additional process time associated with filling in areas to decrease visibility is no longer necessary, resulting in a quicker and hence more cost effective process.

The transparent substrate 14 can be composed of a variety of different materials, including glass, plastic, or metal. Typical substrates tend to be made of polyethylene terephthalate (PET) because of its low cost and advantageous features, including transparency, flexibility, resilience, ease of manufacture, etc. PET substrates can be manufactured using one or more ways known to those with skill in the art of transparent conductive film processing, and which in some examples can be provided in a roll suitable for roll-to-roll processing. A non-exhaustive list of other possible substrate materials includes glass, polyethylene naphthalate, polyurethane, and various metals. The substrate 14 shown in FIG. 3 has a thickness of about 0.13 mm and is made of polyethylene terephthalate. In this thickness range, PET along with other suitable materials are flexible and can be stored, transported, or configured for processing in a roll of predetermined width. The substrate 14 is typically transparent for visual display applications such that when the substrate 14 is later applied to a display device (not shown), light from the display device may propagate through the substrate 14 towards a user of the device.

In typical examples of flexible transparent conductive films, rough stock is provided in a roll or in a flat sheet configuration for laser pattern processing of the transparent conductive film so that the rough stock becomes processed stock suitable for use in various applications, such as optoelectronic devices. In some examples, transparent conductive film material includes silver nanowires (also referred to as SNW or AgNW) deposited to a predetermined thickness or conductivity, both of which are typically set by increasing or decreasing the density of the silver nanowires in the film production phase. In other examples, transparent conductive film can include other materials or with multiple layers. Transparent conductive films can find end use on rigid surfaces, for example on rigid glass or composite screens. Silver nanowires are well-suited for flexible substrates, as material properties thereof, such as conductivity and structural integrity, are more consistent under bending loads of various types (e.g., fixedly curved, cyclically deformed, or pliable).

The protective layer 16 can also be made of different materials suitable for providing protection from damage due to particulate matter, scuffs, and scratches. The thickness of the protective layer 16 is typically selected to be suitable for providing protection to the underlying substrate 14. One suitable thickness is approximately 0.04 mm, however other thicknesses may be used. Since aspects of the present invention can eliminate the need for removing, reapplying, or replacing the protective layer 16 during manufacture, other possibilities for protective layers 16 may be possible. Currently, conventional protective films 16 can be made from polyethylene or polyethylene terephthalate are suitable for providing the requisite protection of the surface of the substrate 14. The requirements in conventional processes that the protective layer 16 must be removed before and reattached after processing the substrate 14 leads to substantial additional processing time and cost. As applicable with various embodiments of the present invention, it has been discovered that a substrate 14 can be processed without removal and reattachment of the protective layer 16, leading to the potential for revolutionary cost reduction in processing of transparent substrates, including flexible transparent substrates.

Figure 4:
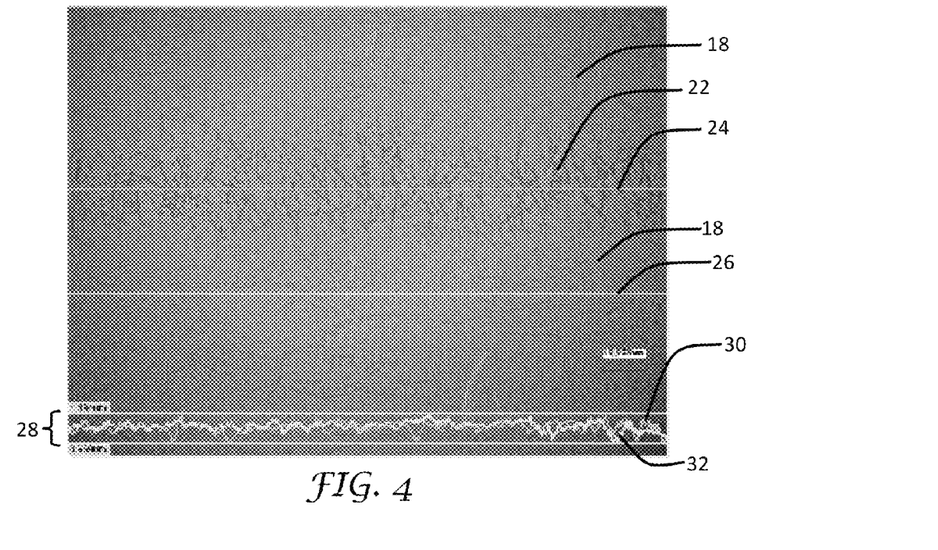
FIG. 4 is an image with overlaid profilometer data of unprocessed and processed areas in accordance with an aspect of the present invention.

FIG. 4 is a similar image of a top view of a target substrate 14 as shown in FIG. 3, with additional surface roughness data superimposed thereon. A first horizontal line 24 extends approximately along a middle of the processed stripe 22. About 30 μm adjacent to first horizontal line 24, a second horizontal line 26 extends parallel therewith along an unprocessed area 18. An area 28 on the bottom of the image includes the transverse depth profiles 30, 32 along the respective parallel lines 24, 26. The depth profiles are overlaid on one another and show minimal variation with respect to each other in a common range of approximately 0.2 μm of depth, further demonstrating the non-ablative effects associated with processes in accordance with aspects of the present invention. Other surfaces may have a larger range of depth variation depending on the quality of the substrate and conductive surface layer, however the variation between processed and unprocessed areas is minimal under the non-ablative processes herein.

Figure 5A:
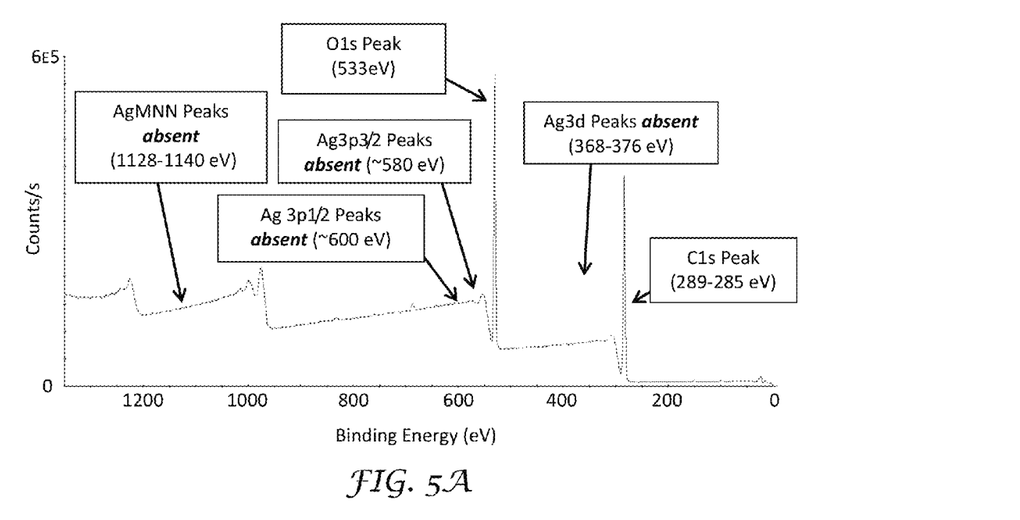
FIGS. 5A and 5B are XPS plots of unprocessed and processed areas, respectively, in accordance with an aspect of the present invention.
Figure 5B:
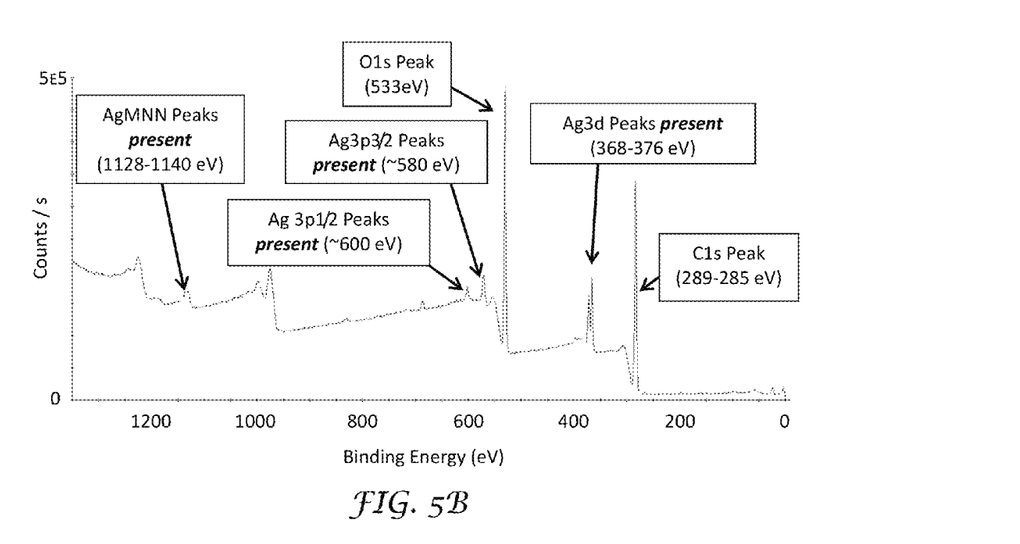
Figure 6:
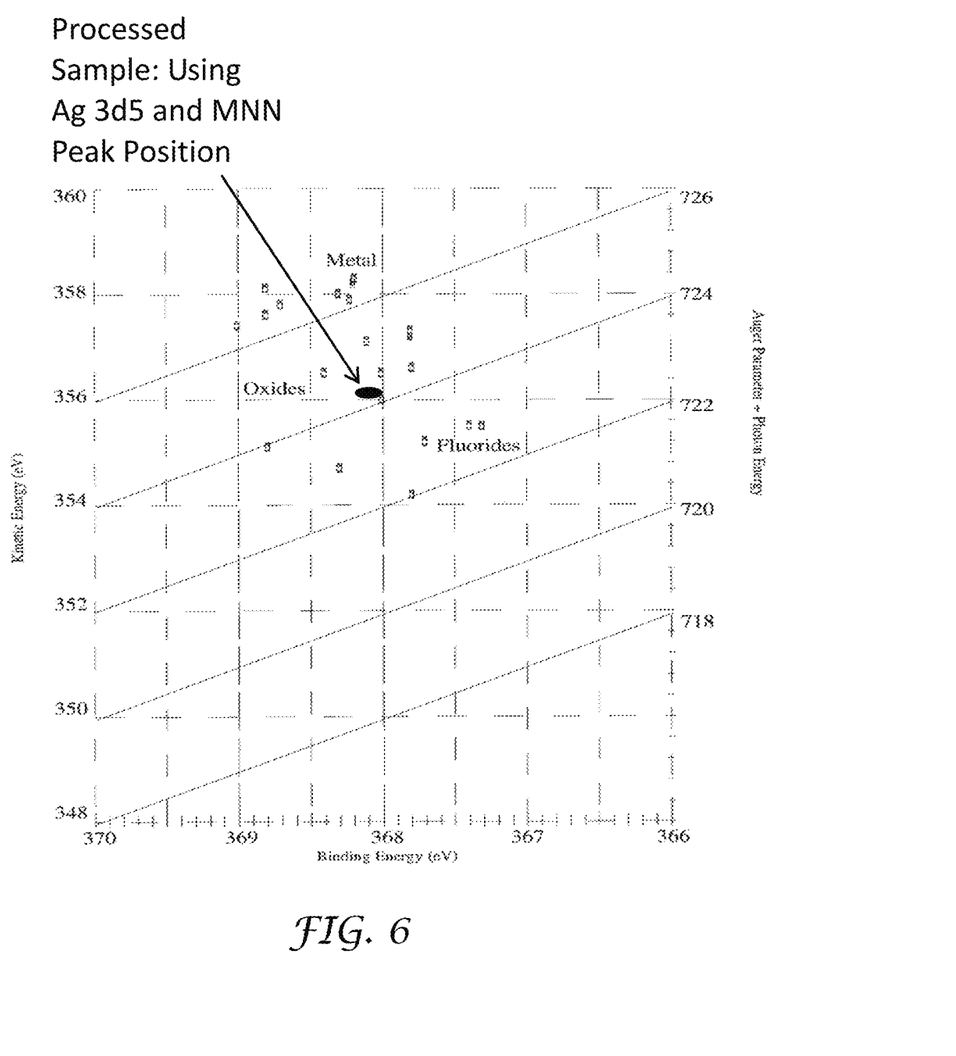
FIG. 6 is an XPS plot of selected species from the plot in of FIG. 5B.

FIGS. 5A and 5B show x-ray photoelectron spectroscopy (XPS) results for unprocessed (FIG. 5A) and processed (FIG. 5B) areas of a substrate 14, indicating counts per second with respect to binding energy. The XPS generally assist in explaining the elemental content of targeted surfaces and resulting material changes that may occur from various external inputs. The results shown for unprocessed and processed areas are substantially the same across a range of binding energies, with some particular exceptions. Binding energy peaks for AgMNN, Ag 3p3/2, Ag 3p1/2, and Ag 3d, appear in processed areas 20, generally indicating the presence of oxidized silver. For example, referring to FIG. 6, a plot of binding energy with respect to kinetic and photon energies centered around 368 eV and generally indicates oxide formation in the processed area. Also, comparison of various carbon species, chlorine, fluorine, oxygen, and silicon signal data suggests that the polymer matrix in which the silver nanowires are embedded is present before and after processing by the laser pulses. Thus, it is likely that organic overcoat is selectively removed from the silver nanowires, allowing the nanowires to become oxidized and exhibit a non-conductive characteristic, while the remainder of the overcoat remains substantially intact. In general, silver nanowires can exhibit attributes superior to more conventional transparent conductive films like Indium Tin Oxide (ITO). The transparent conductive layer 18 is typically on the order of a few tens of nanometers thick. Silver nanowires tend to be approximately 10 μm long and in the range of several to several tens of nanometers in diameter, though other dimensions may be possible.

Laser parameters suitable for non-ablative laser processing in accordance with the methods of the present invention can be selected based in part on the relevant properties of the materials selected to be processed. For example, varying thickness of the underlying substrate, the thin conductive layer, etc., can affect how laser pulse heat may be distributed or result in other time-dependent effects requiring mitigation. The optimized process parameters will result in a processed area or feature having ultra-low visibility as compared to adjacent or separate unprocessed areas. One area of optimization can include laser pulse wavelength. The wavelength of light used to process samples shown in the images herein is 1064 nm, and is generally preferred since such longer wavelength light interacts with the transparent substrate, protective film, or other material or material layers in proximity, less than shorter wavelengths. Other techniques, such as photolithography, often require wavelengths which are more difficult or expensive to produce, such as wavelengths in the visible or UV spectra.

By processing target substrates in accordance with methods herein, various advantages can be realized over conventional manufacturing techniques for processing transparent substrates, as becomes apparent in light of the present disclosure. Accordingly, it is thought that the present invention and many of the attendant advantages thereof will be understood from the foregoing description and it will be apparent that various changes may be made in the parts thereof without departing from the spirit and scope of the invention or sacrificing all of its material advantages, the forms hereinbefore described being merely exemplary embodiments thereof.

What is claimed is:

1. A method for processing a transparent substrate, comprising:
    generating at least one laser pulse having laser parameters selected for non-ablatively changing a conductive layer, having a thickness of less than 100 nm and including silver nanowires, disposed on said transparent substrate into a non-conductive feature including silver nanowires; and
    directing said pulse to said conductive layer;
    wherein said laser parameters include a pulse length of less than about 200 ps and a pulse fluence of less than about 1.5 J/cm$^2$.

2. The method of claim 1 wherein a spot size of said pulse is varied within a range of 5 to 100 μm by varying the position of the substrate in relation to the incident pulse.

3. The method of claim 1 wherein the transparent substrate includes a protective film disposed on a surface of said substrate opposite from said conductive layer, and which protective film is not removed during the non-ablative processing of said conductive layer.

4. The method of claim 1 wherein the transparent substrate is made of a flexible polyethylene terephthalate material.

5. The method of claim 1 wherein to an unaided eye of an observer said non-conductive feature is visibly indistinguishable as compared to an adjacent unprocessed conductive layer.

6. The method of claim 1 wherein said pulse is directed through said transparent substrate to said conductive layer.

7. The method of claim 1 wherein the surface roughness of the conductive layer is substantially unchanged after processing with said laser pulse.

8. The method of claim 1 wherein said conductive layer becomes non-conductive in the processed area through a selective oxidation mechanism.

9. The method of claim 1, wherein the silver nanowires of the conductive layer are situated in an organic overcoat.

10. A method for changing the sheet resistance of a conductive matrix of silver nanowires on a flexible transparent substrate, comprising:
    generating at least one pulse with laser parameters selected in a range for increasing the sheet resistance of the conductive matrix without ablating the silver nanowires; and directing the pulse to the conductive matrix to increase said sheet resistance;

wherein the flexible transparent substrate includes a protective film disposed on a surface of the substrate opposite from said conductive matrix of silver nanowires, and which protective film is not removed during the non-ablative processing of said conductive matrix by said laser pulse.

11. The method of claim 10 wherein to an unaided eye of an observer an area processed by a plurality of said laser pulses is visibly indistinguishable as compared to an adjacent unprocessed area.

12. The method of claim 10, wherein the conductive matrix of silver nanowires includes an organic overcoat.

13. A method for processing a transparent substrate with a pulsed laser beam, the substrate being characterized by having conductive silver nanowires disposed on a selected surface thereof, the conductive silver nanowires capable of experiencing non-ablative change into non-conductive silver nanowires with a pulsed laser beam having selected parameters, said method comprising:

generating at least one laser pulse with said selected parameters; and directing said pulse to the conductive silver nanowires on the substrate to produce said change into non-conductive silver nanowires;

wherein the conductive silver nanowires are situated in an organic overcoat.

14. The method of claim 13 wherein the transparent substrate includes a protective film disposed on a surface of said substrate opposite from said conductive silver nanowires, and which protective film is not removed during the non-ablative processing of said conductive silver nanowires.

15. The method of claim 13 wherein to an unaided eye of an observer said non-conductive silver nanowires are visibly indistinguishable as compared to unprocessed conductive silver nanowires.

16. The method of claim 13, wherein said pulse is directed to the conductive silver nanowires on the substrate without directing said pulse to an over-oxidized layer.

17. A method for processing a conductive silver nanowire layer of a flexible transparent substrate with a pulsed laser beam, the conductive silver nanowire layer characterized in that exposure to a laser pulse having selected laser pulse parameters causes the conductive silver nanowires to become non-conductive silver nanowires without ablatively removing the silver nanowire layer, said method comprising:

generating at least one laser pulse which has said selected laser pulse parameters; and directing said pulse to the conductive silver nanowire layer of the substrate without directing said pulse to an over-oxidized layer.

18. The method of claim 17 wherein the flexible transparent substrate includes a protective film disposed on a surface of said substrate opposite from said conductive silver nanowire layer, and which protective film is not removed during the non-ablative processing of said conductive silver nanowire layer.

19. The method of claim 17 wherein to an unaided eye of an observer said non-conductive silver nanowires formed by the laser pulse are visibly indistinguishable as compared to unprocessed conductive silver nanowires.

20. The method of claim 17, wherein the conductive silver nanowire layer includes an organic overcoat.

* * * * *